SOLID STATE DEVICE WITH REDUCED LEAKAGE CURRENT AT N-P JUNTIONS OVER WHICH ELECTODES PASS

Filed May 26, 1966

INVENTORS,
ARMAND P. LA ROCQUE
GORDON MC NEIL.
BY Harry M. Saragovitz, Edward J. Kelly, Herbert Berl & Julian C. Keppler
ATTORNEYS United States Patent Office 3,426,253
Patented Feb. 4, 1969

3,426,253

SOLID STATE DEVICE WITH REDUCED LEAKAGE CURRENT AT N-P JUNCTIONS OVER WHICH ELECTRODES PASS

Armand P. La Rocque, New Shrewsbury, and Gordon McNeil, Long Branch, N.J., assignors to the United States of America as represented by the Secretary of the Army Filed May 26, 1966, Ser. No. 553,603
U.S. Cl. 317—234 5 Claims
Int. Cl. H01l 3/00, 7/02

ABSTRACT OF THE DISCLOSURE

An improved semiconductor device wherein current leakage at an n-p junction in the region thereof over which an electrode passes is minimized by etching to remove the most heavily doped material in said region.

This invention relates to an improved semiconductor device and a method for making such a device wherein current leakage at junctions between opposite conductivity type materials is minimized at the region where contacts pass the lateral boundary of said junctions.

The prior art method of forming metal interconnections on integrated circuit substrates, such as silicon, involves depositing a thin film metallic electrode, such as aluminum, on an electrically insulating layer, such as a layer of silicon dioxide, to prevent the metal from touching the semiconductor substrate in regions where contact is undesirable. When the metal traverses the edge of a junction, particularly, the n-p junction of a reverse biased diode having n-type material diffused into a p-type substrate, or the base-collector junction of a p-n-p planar monolithic semiconductor transistor, severe leakage current often occurs. This leakage is caused by the creation of charges at the interface between the outer surface of the semiconductor substrate and the oxide insulating layer owing to the presence of a metal electrode over the oxide layer. These charges are especially mobile when there is the greatest degree of doping, that is, at the outermost region of the substrate and when there is the greatest disparity of doping type, for example where an n+ region lies adjacent to a p+ region.

In accordance with the invention, a new approach to the fabrication of integrated circuits is disclosed for minimizing the undesirable leakage current. Wherever the metal electrodes must cross an n-p junction, the silicon substrate is etched to remove the most heavily doped material. The oxide insulating layer then is replaced prior to application of the metal film electrode. Any charges created by the metal electrode near the juncture of the lateral boundary of the n-p junction and the silicon-oxide interface are not as mobile or subject to such doping disparity as with the technique of the prior art, consequently, junction leakage is markedly reduced.

An object of the invention is to reduce appreciably the leakage current at an n-p junction of a semiconductor device for integrated circuits when electrical circuit connections must pass in the vicinity of said junction.

Other objects of the invention will become apparent after referring to the specification and to the drawings wherein.

Figure 1:
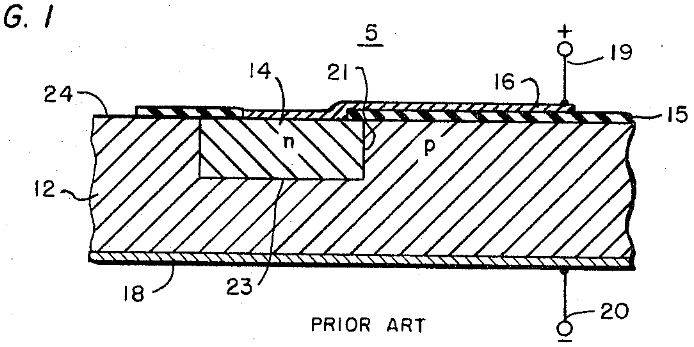
FIG. 1 is a cross-sectional view showing a prior art version of a semiconductor device with a circuit interconnection passing across an n-p junction.

Referring to the prior art structure of FIG. 1 of the drawing, the typical diode which forms an element of a semiconductor monolithic integrated circuit is indicated by reference numeral 5. The diode 5 comprises a substrate 12 which is made of p-type conductivity material, usually silicon containing boron as a donor impurity, a zone 14 made of n-type conductivity material, such as phosphorus, diffused into substrate 12, an electrically insulating film 15, usually an oxide of the semiconductor material making up regions 12 and 14, a metal electrode 16 contacting directly a portion of region 14 and a metal electrode 18 disposed directly on at least a portion of one major surface of region 12. The p-region 12 and n-region 14 combine to form an n-p junction having a lateral boundary 21 and a lower boundary 23. The lateral boundary of the n-p junction extends from the lower boundary 23 to the interface between the oxide layer 15 and the outer surface 24 of substrate 12. Electrical connections from electrodes 16 and 18 are provided to positive and negative terminals 19 and 20, respectively. The areas over which the electrical leads pass must be insulated electrically from the semiconductor body 14, 12 in order to prevent undesirable interconnections between p and n regions of said body. It has been found that, with a reverse biased n-p diode, such as shown in FIG. 1, considerable leakage current exists for values of reverse bias well below the value at which avalanche occurs. This leakage current can be explained in the following manner. An electric field is set up between the positive electrode 16 and the oxide-semiconductor interface, that is, the narrow region bounding both the insulating layer 15 and the surface of the n and p regions 12 and 14 of the semiconductor body 14, 12. If the region 12 is made of silicon doped with boron and the region 14 is made of silicon doped with phosphorus, and if the oxide layer 15 is silicon dioxide, then the interface comprises silicon dioxide laden with either boron or phosphorus impurities. Because of the electric field described above, electrons are attracted from both n and p regions 12 and 14 into the silicon dioxide interface. The impurities within the interface provide a leakage path of sufficiently low resistance to permit considerable electron flow along the interface across the uppermost portion of the lateral boundary 21 of the n-p junction and thence to the electrode 16. This leakage path becomes particularly troublesome in the case of n-p junctions where boron is widely used as the donor material, since boron has a decided tendency to accumulate within the oxide at the oxide-semiconductor interface. Acceptor materials such as antimony or phosphorus, on the other hand, are much less likely to accumulate within the oxide than boron, so that p-n junctions are less apt to be characterized by large leakage currents when traversed by electrodes, such as a negative electrode connected to a p-type zone formed in an n-type substrate.

Figure 2:
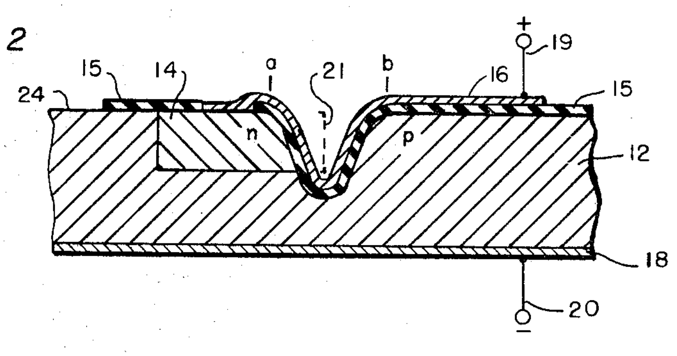
FIG. 2 is a view in cross-section, taken through the plane of the metal electrode, of a typical n-p semiconductor junction device according to the invention.
Figure 3:
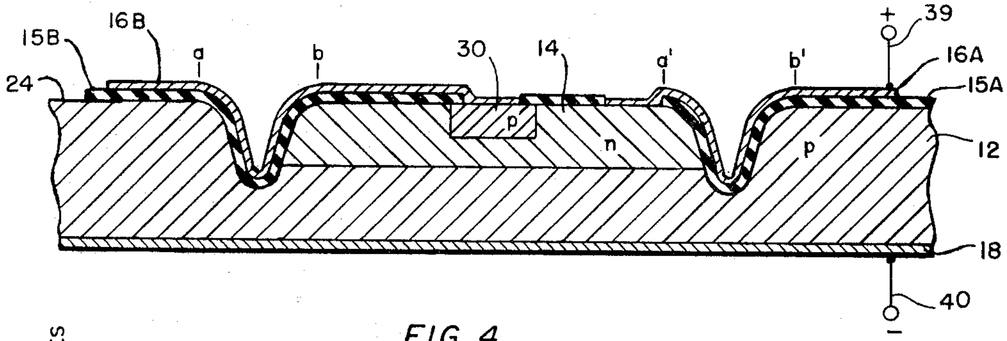
FIG. 3 is a view in cross-section of a typical p-n-p transistor made in accordance with the invention.

Before proceeding to a description of the device according to the invention, reference will be made to the curve of FIG. 5. This figure indicates the concentration of impurities or doping level as a function of the depth or distance from the outer surface of the semiconductor substrate into which diffusion is made. It will be seen that the doping level decreases with depth, that is, that the n-type zone 14 is less heavily doped the further one penetrates into the semiconductor substrate 12 until, at some depth generally indicated by the lower boundary 23, the concentration of impurities becomes substantially equal to that of the more or less homogeneously doped p-region 12. Stated another way, the doping disparity between the respective p and n regions 12 and 14 decreases as depth increases. Since a greater concentration of impurities—contributing to a decrease in leakage path resistance—exists at the portion of the interface between the electrically insulating layer 15 and the semi-conductor body 14, 12 adjacent surface 24, the leakage resistance can be increased considerably by increasing the depth within the semiconductor body 14, 12 to which the outside layer 15 and the overlying metal electrode 16 penetrates, as indicated in FIG. 2. The device shown in FIG. 2 is formed by etching away a portion of the semiconductor body 14, 12 in a region adjacent the lateral boundary of the n-p junction and underlying the position to be occupied by electrical lead 16. The portion of the substrate between *a* and *b* in FIGS. 2 and 4 and between *a* and *b* and between *a'* and *b'* in FIG. 3 are contoured more or less in the shape of a U and, as such, provide leakage paths of increased length, and consequently, of increased leakage resistance, as contrasted to the leakage path length in the prior art device of FIG. 1. After etching, an insulating oxide layer 15 is re-formed, as by any of the well known oxide coating techniques, after which the metal film electrode 16 is deposited over said oxide coating. If the semiconductor body 14, 12 is made of silicon, the oxide coating 15 will be silicon dioxide formed in situ by exposing the semiconductor body 14, 12 to an atmosphere of oxygen within a high temperature over. The metal electrode 16 may be in the form of an aluminum film deposited by evaporation in vacuo. The position occupied by the oxide coating 15 and electrode film 16 may be determined by usual masking techniques. The electrode film 16 will, of course, be deposited in direct contact with a portion of the surface of the n-type region 14. The device of FIG. 2 is characterized in that the most heavily doped n and p material will be removed near the juncture of the lateral boundary 21 of n-type region 14 and the interface between the oxide layer 15 and the outer surface 24 of substrate 12. Since the electrode 16 no longer passes over the n-p junction near a region of high doping disparity, the number of charge carriers attracted to the positive electrode 16 is reduced and, consequently, the undesirable leakage effect is correspondingly reduced.

In FIG. 3 a transistor device is shown which includes a p-type collector 12, an n-type base region 14 and a p-type emitter 30. The n-p base-collector junction, including regions 12 and 14, is reverse biased as in the case of the n-p diode 14, 12 of FIG. 2. The substrate 12 in the region of the lateral boundary of n-type zone 14 is etched away, as shown in FIG. 3 and oxide layers 15A and 15B are formed over the outer surface 24 of substrate 12, including the contoured portions of surface 24 between *a* and *b* and between *a'* and *b'*. A base electrode 16A is deposited over oxide layer 15A and is connected to a positive terminal 39. The collector electrode 18 is connected to the negative terminal 40, while the thin film emitter electrode 16B of the transistor is deposited over the oxide layer 15B. The region etched away is similar to that shown for the diode of FIG. 2.

Figure 4:
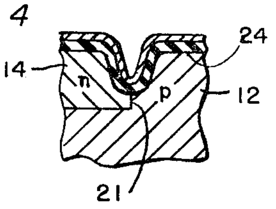
FIG. 4 is a fragmentary cross-section view showing a modified form of the device shown in FIGS. 2 and 3.
Figure 5:
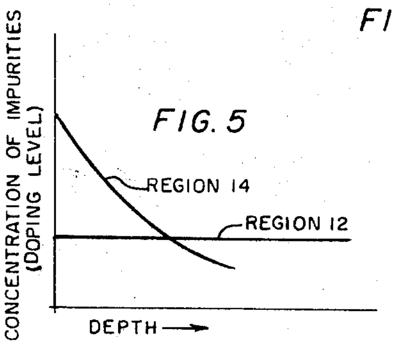
FIG. 5 is a curve illustrating certain principles of operation of the device shown in FIGS. 2 to 4.

Although the maximum depth of the contoured portion of the device of FIGS. 2 and 3 is shown as greater than the depth of the n-type zone, it should be understood that the depth of penetration may be less than the total depth of the n-type zone, as shown in FIG. 4. The basic concept is to position the metal electrode and the accompanying insulating film so that it passes over the lateral boundary 21 of the junction at such a level that the impurity concentration is substantially below that existing at the portion of the junction adjacent to the outer surface 24 of the substrate.

What is claimed is:

1. An electron device comprising a semiconductor body having a substrate of p-conductivity type material and a solid state zone of n-type conductivity material formed within said substrate to a predetermined depth, said n-type zone having a surface common to a major surface of said substrate, said substrate and zone combining to form an n-p junction, said junction having a lateral boundary extending downwardly from said common surface to said predetermined depth, an electrically insulating layer disposed over a portion of said common surface and passing over said lateral boundary, and an electrode bonded to a portion of said zone and deposited over said insulating layer, said electrode passing over said lateral boundary, the surface of said semiconductor body having substantially a U-shaped contour extending into said semiconductor body in the region in which said electrode passes over said lateral boundary.

2. An electron device according to claim 1 wherein said n-p junction is reverse biased.

3. An electron device according to claim 1 wherein said semiconductor is silicon and said insulating layer is silicon dioxide.

4. An electron device according to claim 1 wherein the portion of said electrode passing over said lateral boundary is disposed deeper in said substrate than said predetermined depth.

5. An electron device according to claim 1 wherein the portion of said electrode passing over said lateral boundary is disposed at a depth between said common surface and said predetermined depth at which the doping disparity between said n-type zone and said p-type substrate is relatively small.

References Cited

UNITED STATES PATENTS

| | | | |
|---|---|---|---|
| 3,142,021 | 7/1964 | Steimak | 317—235 |
| 3,304,595 | 2/1967 | Sato et al. | 317—235 |
| 3,332,143 | 7/1967 | Gentry | 317—235 |
| 3,339,086 | 8/1967 | Shockley | 317—235 |
| 3,345,222 | 10/1967 | Nomura et al. | 317—235 |

JOHN W. HUCKERT, *Primary Examiner.*

A. J. JAMES, *Assistant Examiner.*

U.S. Cl. X.R.

317—235